(12) United States Patent
Buchanan et al.

(10) Patent No.: US 10,593,403 B2
(45) Date of Patent: Mar. 17, 2020

(54) MEMRISTIVE ARRAYS WITH A WAVEFORM GENERATION DEVICE

(71) Applicant: Hewlett Packard Enterprise Development LP, Houston, TX (US)

(72) Inventors: Brent Buchanan, Fort Collins, CO (US); Le Zheng, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/073,902

(22) PCT Filed: Feb. 23, 2016

(86) PCT No.: PCT/US2016/019104
§ 371 (c)(1),
(2) Date: Jul. 30, 2018

(87) PCT Pub. No.: WO2017/146683
PCT Pub. Date: Aug. 31, 2017

(65) Prior Publication Data
US 2019/0043577 A1 Feb. 7, 2019

(51) Int. Cl.
*G11C 11/00* (2006.01)
*G11C 13/00* (2006.01)

(52) U.S. Cl.
CPC ........ *G11C 13/0069* (2013.01); *G11C 13/003* (2013.01); *G11C 13/0028* (2013.01); *G11C 2013/0071* (2013.01); *G11C 2013/0092* (2013.01); *G11C 2213/79* (2013.01)

(58) Field of Classification Search
CPC ............ G11C 13/0069; G11C 13/0028; G11C 13/003; G11C 2013/0071; G11C 2013/0092; G11C 2213/79
See application file for complete search history.

(56) References Cited

U.S. PATENT DOCUMENTS

| | | | |
|---|---|---|---|
| 6,625,054 B2 | 9/2003 | Lowrey et al. | |
| 8,233,318 B2 | 7/2012 | Ramani et al. | |
| 8,749,422 B1 * | 6/2014 | Moore | G11C 27/02 341/120 |
| 9,324,421 B2 * | 4/2016 | Perner | G11C 13/0007 |

(Continued)

FOREIGN PATENT DOCUMENTS

WO  WO-2004025659  3/2004

OTHER PUBLICATIONS

Indiveri G. et al., "Integration of Nanoscale Memristor Synapses in Neuromorphic Computing Architectures", < http://arxiv.org/pdf/1302.7007.pdf > (Research Paper), Feb. 27, 2013, 22 pages.

(Continued)

*Primary Examiner* — Pho M Luu

(57) ABSTRACT

A memristive array includes a number of bit cells, each bit cell including a memristive element and a selecting transistor serially coupled to the memristive element. The array also includes a waveform generation device coupled to the number of bit cells. The waveform generation device generates a shaped waveform to be applied to the number of bit cells to switch a state of the memristive element. The waveform generation device passes the shaped waveform to gates of the selecting transistors of the number of bit cells.

16 Claims, 8 Drawing Sheets

(56) References Cited

U.S. PATENT DOCUMENTS

| | | | |
|---|---|---|---|
| 9,847,128 B2* | 12/2017 | Buchanan | G11C 13/0002 |
| 2009/0067229 A1 | 3/2009 | Kang et al. | |
| 2009/0161423 A1 | 6/2009 | Sugibayashi et al. | |
| 2012/0057390 A1 | 3/2012 | Yi et al. | |
| 2014/0204651 A1 | 7/2014 | Perner | |
| 2014/0289179 A1 | 9/2014 | Di Castro et al. | |
| 2014/0334222 A1 | 11/2014 | Bateman et al. | |

OTHER PUBLICATIONS

International Search Report & Written Opinion received in PCT Application No. PCT/US2016/019104, dated Nov. 16, 2016, 10 pages.

\* cited by examiner

MEMRISTIVE ARRAYS WITH A WAVEFORM GENERATION DEVICE

BACKGROUND

Memristive elements, for example memristors, are devices that may be programmed to different resistive states by applying a programming stimulus, for example a voltage pulse or a current pulse. After programming, the state of the memristive element may be read. The state of the memristive element remains stable long enough to regard the device as non-volatile. A number of memristive elements may be included within a crossbar array in which a number of column lines intersect with a number of row lines, the memristive element being located at the intersection of a column line and a row line. Memristor elements can be used in a variety of applications, including non-volatile solid state memory, programmable logic, signal processing, control systems, pattern recognition, and other applications.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
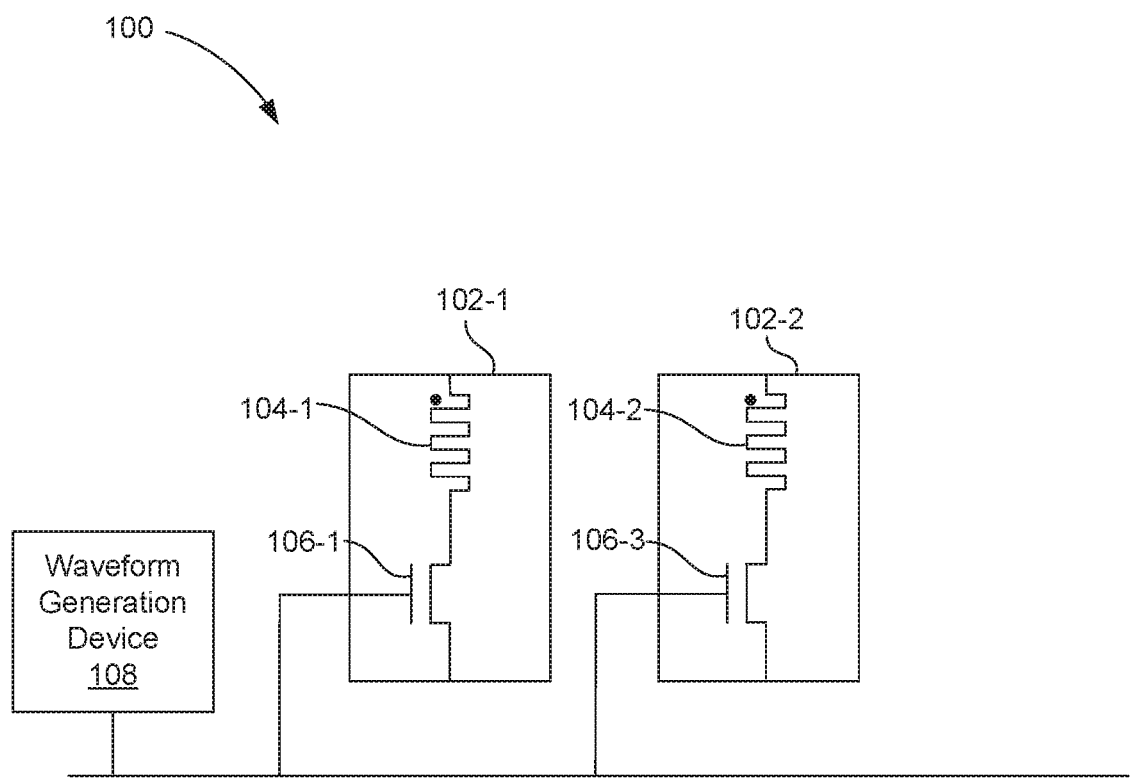
FIG. 1 is a diagram of a memristive array with a waveform generation device, according to one example of the principles described herein.

Arrays of memristive elements such as memristors may be used in a variety of applications, including non-volatile solid state memory, programmable logic, signal processing, control systems, pattern recognition, and other applications.

Increasingly smaller computing devices have led to an increased focus on developing smaller components, such as memory arrays and integrated circuits that carry out the functions listed above as well as other functions. Crossbar arrays are one example of reduced-size memory arrays. A crossbar array includes a first set of interconnect lines that intersect a second set of interconnect lines, in an approximately orthogonal orientation for example. A bit cell is placed at each intersection. A bit cell may include a memory element to store information and a selector to allow or prevent current flow through the memory element. In this example, a number of memory elements may share a particular row line and another number of memory elements may share a particular column line. In the present application, for simplicity row lines and column lines are used to refer to groupings of memristive elements. However, the row lines and the column lines as used herein may be switched and still allow for the implementation of the subject matter of the present application.

The array of the present application can also be used to perform a multiply-accumulate (MAC) operation of, for example, a number of matrix values and a number of input vector values. For example, an input voltage signal along each row of an array is weighted by the resistance of the memristive elements in a column, and accumulated as the current output from each column. Accordingly, a state of a memristive element can be used to either store information such as in a memory array, or can be used to perform operations such as a multiply-accumulate operation which is used in filtering.

In either case, each memory element can represent multiple logic values, for example a 1 and a 0, or an analog level. Memory elements such as memristive elements use resistance levels to indicate a particular logic or analog value. In using a memristor as an element in a memory array, a digital operation is emulated by applying an activation stimulus such as voltage pulses of different values or polarities to place the memristive element in a "low resistance state," a "high resistance state," or an intermediate resistance state, which resistance states are associated with either a logical value, such as "1" or "0," or an analog value, respectively. Switching a memristive element such as a memristor from an initial high resistance state to a low resistance state is referred to as a "set" operation and switching a memristive element from a low resistance state to a high resistance state is referred to as a "reset" operation. While specific reference is made to a voltage, other activation stimuli may be used such as a current.

Each memristive element has a switching voltage which refers to a voltage potential across a memristive element which effectuates a change in the resistance state of the memristive element. For example, a switching voltage of a memristive element may be between 1-2 volts (V). In this example, a voltage potential across the memristive element that is greater than the switching voltage (i.e., the 1-2V) causes the memristive element to change between resistance states.

This voltage potential across the memristive element is applied via different row lines that are coupled to the memristive element. However, as memristive elements share row lines, other memristive elements, other than the one intended to be switched, also see the same voltage potential and therefore may inadvertently switch. Accordingly, a selector may be placed serially with a memristive element. The selector may have a threshold voltage. An applied voltage less than the threshold voltage does not pass through to the corresponding memristive element and thus the memristive element does not see the voltage potential. While memristive element arrays have the potential for widespread application, some characteristics reduce their usefulness in certain applications.

For example, the switching voltages used to switch a memristive element between states is often applied as a square waveform pulse. However, experimentation has shown that applying a non-square waveform pulse leads to improved behavior. For example, a memristive element is more durable if a shaped waveform is used and the state of the memristive element is better retained if a shaped waveform is used. Still further, read and write margins for the individual memristive elements are improved. However, implementation of the shaped waveform to switch a state of a memristive element has been difficult. For example, shaped waveforms are generally applied at the rails, i.e., the row lines of the bit cell. However, due to the capacitance of these row lines, plus the voltage drop due to current through the rails, also known as an IR drop, when going further along a row line and as memristive elements along a row line switch, the shape of the waveforms may change such that the ultimate waveform seen by a particular memristive element is unknown. Such uncertainty in the shape of the ultimate waveform may be less effective in controlling the switching of a memristive element. Some of these complications can be overcome with circuitry, but such circuitry is complex, costly, and doesn't ensure that a waveform input at a row line is the same waveform that will be seen by the memristive element.

Accordingly, the present specification describes an array with a waveform generation device that gives greater control over the waveform applied to a memristive element. More specifically, the waveform generation device of the present application generates the waveform and then passes it to a gate of a selecting transistor of a bit cell. In so doing, complications arising from the use of a row line rail are alleviated as the gate of the transistor does not draw material current, and so won't be affected by IR drop.

More specifically, the present specification describes a memristive array. The memristive array includes a number of bit cells. Each bit cell includes a memristive element and a selecting transistor serially coupled to the memristive element. The array also includes a waveform generation device coupled to the number of bit cells. The waveform generation device 1) generates a shaped waveform to be applied to the number of bit cells to switch a state of the memristive element and 2) passes the shaped waveform to gates of the selecting transistors of the number of bit cells.

The present specification also describes an array of memristive elements. The array includes a number of row lines and a number of bit cells disposed between adjacent row lines. Each bit cell includes a memristive element serially coupled to multiple parallel selecting transistors. Gates of the parallel selecting transistors of a column of bit cells are coupled to one another via a column line. Each bit cell also includes a number of diodes to regulate current flow through one of the parallel selecting transistors. The system also includes a number of waveform generation devices. A waveform generation device is coupled to a column of bit cells and includes multiple waveform generation cells. Each waveform generation cell includes a resistor, a regulating transistor, a diode to isolate the waveform generation cell, and a switch to activate the waveform generation cell. Gates of the regulating transistors are coupled to gates of selecting transistors of a corresponding column of bit cells via the column line. Each waveform generation cell generates a distinct waveform that is passed to gates of selecting transistors of the corresponding column of bit cells.

The present specification further describes a method for switching a memristive element. According to the method, a voltage potential across a bit cell is generated via row lines corresponding to the bit cell. The same voltage potential is generated across a waveform generation device corresponding to the bit cell via row lines corresponding to the waveform generation device. An output gate waveform is passed to a gate of the bit cell by combining an input waveform and feedback from the waveform generation cell through an operational amplifier of the waveform generation device.

Using a waveform generation device that passes a non-square waveform to the gate of a bit cell 1) gives more control over the waveform pulse passed to a memristive element, which waveform pulse is used to switch the state of the memristive element; 2) avoids complications in passing a waveform via the row lines of an array; and 3) reduces the complexity and cost associated with applying a dynamic shaped waveform to the memristive array. However, it is contemplated that the devices disclosed herein may provide useful in addressing other matters and deficiencies in a number of technical areas. Therefore the systems and methods disclosed herein should not be construed as addressing any of the particular matters.

As used in the present specification and in the appended claims, the term "memristive element" or "memristor" may refer to a passive two-terminal circuit element that maintains a functional relationship between the time integral of current, and/or the time integral of voltage.

Further, as used in the present specification and in the appended claims, the term "switching voltage" may refer to a voltage potential across a memristive element which effectuates a change in the resistance state of the memristive element. For example, a switching voltage of a memristive element may be between 1-2 volts (V). In this example, a voltage potential across the memristive element that is greater than the switching voltage (i.e., the 1-2 V) causes the memristive element to change between resistance states. A memristive element may have multiple switching voltages. For example, a first switching voltage may be a voltage which, if surpassed, "sets" the memristive element from a high resistance state to a low resistance state. Similarly, a second switching voltage may a voltage which, if surpassed, "resets" the memristive element from a low resistance state to a high resistance state. While specific reference is made to a voltage pulse, the activation energy to change the state of the memristive element may also be provided by a current source.

Further, as used in the present specification and in the appended claims, the term "target" refers to a memristive element that is to be written to or read from. Target row lines, and target column lines are those row lines and column lines that correspond to the target memory element. A target memristive element may refer to a memristive element with a closed selector as opposed to an open selector.

Even further, as used in the present specification and in the appended claims, the term "a number of" or similar language is meant to be understood broadly as any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language indicates that a particular feature, structure, or characteristic described in connection with that example is included as described, but may not be included in other examples.

Turning now to the figures, FIG. 1 is a diagram of a memristive array (100) with a waveform generation device (108). The memristive array (100) includes a number of bit cells (102-1, 102-2,). Each bit cell (102) includes a memristive element (104-1, 104-2,) and a selecting transistor (106-1, 106-3). As used in the present specification, the indicator "-*" refers to a specific instance of an element. For example, a first bit cell is referenced as (102-1). The absence of the indicator "-*" refers to the element in general. For example, a generic bit cell is referenced as (102).

The memristive array (100) may be implemented in an electronic device. Examples of electronic devices include servers, desktop computers, laptop computers, personal digital assistants (PDAs), mobile devices, smartphones, gaming systems, and tablets, among other electronic devices. The memristive array (100) may be utilized in any data processing scenario including, stand-alone hardware, mobile applications, through a computing network, or combinations thereof. Further, the memristive array (100) may be used in a computing network, a public cloud network, a private cloud network, a hybrid cloud network, other forms of networks, or combinations thereof.

The memristive element (104) of the memristive array (100) can be used to represent a number of bits of data or an analog value. For example, a memristive element (104) in a low resistance state may represent a logic value of "1." The same memristive element (104) in a high resistance state may represent a logic value of "0." Each logic value is associated with a resistance state of the memristive element (104) such that data can be stored in a memristive element (104) by changing the resistance state of the memristive element (104). This may be done by applying a voltage potential across a target memristive element (104) by passing voltages to conduction lines that correspond to the target memristive element (104).

A memristive element (104) may change resistances by transporting dopants within a switching layer to increase or decrease the resistivity of the memristive element (104). As a sufficient voltage is passed across the memristive element (104) the dopants become active such that they move within a switching layer and thereby change the resistance of the memristive element (104).

A memristive element (104) is non-volatile because the memristive element (104) maintains its resistivity, and indicated logic value even in the absence of a supplied voltage. In this manner, the memristive elements (104) are "memory resistors" in that they "remember" the last resistance that they had. Put another way, if charge flows in one direction through a memristive element (104), the resistance of that component of the circuit will increase. If charge flows in the opposite direction in the memristive element (104), the resistance will decrease. If the flow of charge is stopped by turning off the applied voltage, the memristive element (104) will "remember" the last resistance that it had, and when the flow of charge starts again the resistance of the memristive element (104) will be what it was when it was last active.

Memristive elements (104) in a memristive array (100) take many forms. One example is a metal-insulator-metal structure where the memristive elements (104) include a first conductive electrode a second conductive electrode and a switching element placed between the conductive electrodes. The first and second conductive electrodes may be formed of an electrically conductive material such as AlCu, AlCuSi, TaAl, TiN, HfN, AlN, Pt, Cu, and WSiN. In some examples the first and second electrode are formed of the same material, and in other examples the second electrode is formed of a different material than the first electrode. In some examples, the first conductive electrode and the second conductive electrode may be referred to as a top electrode and a bottom electrode. In the figures, the top electrode is indicated with a dot.

The switching element may be formed of a switching oxide, such as a metallic oxide. Specific examples of switching oxide materials may include magnesium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, copper oxide, zinc oxide, aluminum oxide, gallium oxide, silicon oxide, germanium oxide, tin dioxide, bismuth oxide, nickel oxide, yttrium oxide, gadolinium oxide, and rhenium oxide, among other oxides. In addition to the binary oxides presented above, the switching oxides may be ternary and complex oxides such as silicon oxynitride. The oxides presented may be formed using any of a number of different processes such as sputtering from an oxide target, reactive sputtering from a metal target, atomic layer deposition (ALD), oxidizing a deposited metal or alloy layer, etc. The memristive elements (104) may be fabricated through any other reasonably suitable fabrication process, such as, for example, chemical vapor deposition, sputtering, etching, lithography, or other methods of forming memristive elements (104).

The memristive elements (104) may be built at the micro- or nano-scale and used as a component in a wide variety of electronic circuits, such as, bases for memories and logic circuits. As described above, when used as a basis for memories, the memristive elements (104) may be used to store a bit of information, 1 or 0. When used as a logic circuit, as described herein, the memristive elements (104) may be employed to represent bits in a field programmable gate array, as the basis for a wired-logic programmable logic array, or as a dot product engine. The memristive elements (104) disclosed herein may also find use in a wide variety of other applications. While specific reference is made to binary memristive elements (104), the memristive elements (104) may be set to more than two resistance states and thereby capable of storing more than two logic values.

More detail regarding switching the state of a memristive element (104) is now given. The state of the memristive elements (104) may be changed in response to various programming conditions and the memristive element (104) is able to exhibit a memory of past electrical conditions. For instance, the memristive element (104) may be programmed to have one of a plurality of distinct states. Particularly, the resistance level of the switching element may be changed through application of an electrical field, e.g., through application of a current or voltage, in which the current or voltage may cause mobile dopants in the switching element to move and/or change the status of conducting channel(s) in the switching element, which may alter the resulting electrical operation of the memristive element (104). That is, for instance, the distinct resistance levels of the switching element, and thus the state of the memristive element (104), may correspond to different programming current levels or voltage amplitudes applied to the switching element.

By way of example, the switching element may be programmed to have a higher resistance level through application of an earlier current or voltage level. After removal of the current or voltage, the locations and characteristics of the dopants or conducting channels are to remain stable until the application of another programming electrical field. That is, the switching element remains at the programmed resistance level following removal of the current or voltage. While specific reference is made to memristive elements (104), other resistive memory elements may be used also. Other examples of resistive memory elements include resistive random-access memory (RRAM) elements, phase-change random-access memory (PCRAM), and magnetoresistive random-access memory (MRAM).

Each bit cell (102) also includes a selecting transistor (106). A selecting transistor (106) is serially coupled to a corresponding memristive element (104). A selecting transistor (106) is a component that either allows current to flow through the memristive element (104) or prevents current from flowing through the memristive element (104). For example, the selecting transistor (106) opens and closes to either form a closed circuit or an open circuit in the bit cell (102). The selecting transistor (106) has a threshold voltage, $V_t$. When a voltage applied to the gate of a selecting transistor (106) is less than the threshold voltage, the selecting transistor (106) is open such that no current flows to a corresponding memristive element (104). By comparison, when a voltage applied to the transistor gate is at least as great as the threshold voltage, the selecting transistor (106) closes such that current readily flows to a corresponding memristive element (104). In other words, if the selecting transistor (106) is open, no current flows through the bit cell (102) and the memristive element (104) is not selected, regardless of any voltage passed along corresponding row lines (i.e., the other two terminals of the bit cell (102)). However, if the selecting transistor (106) is closed, and a voltage potential exists across a bit cell (102) row lines, current flows through the bit cell (102). Put yet another way, a selected, or target bit cell (102) is one that sees a voltage potential via the adjacent row lines as well as has a closed selecting transistor (106).

The array (100) also includes a waveform generation device (108). The waveform generation device (108) is coupled to the number of bit cells (102). Specifically, the waveform generation device (108) is parallel-coupled to the number of bit cells (102). The waveform generation device (108) generates a shaped waveform that is applied to the number of bit cells (102). As described above, a square, and static waveform pulse, while able to switch the state of a memristive element (104), is not ideal in that a shaped, and dynamic waveform, may result in better endurance, retention, and read margins for the memristive element (104). In other words, applying a shaped, non-square, waveform to the memristive element (104) allows for improved operation, and more control over the operation, of the memristive element (104).

The shaped waveform may be a non-square waveform. For example, in some cases, as in a set operation, the shaped waveform may be a pulse waveform that has a decreasing amplitude. In other examples, as in a reset operation, the shaped waveform may be a pulse waveform that has an increasing amplitude. While specific reference is made to waveforms of increasing and decreasing amplitude, any shape of waveform can be generated and applied to the gates of the selecting transistors (106).

The waveform generation device (108) can generate multiple, and different, types of waveforms. For example, during a set operation, the waveform generation device (108) may generate one type of waveform such as a waveform with a pulse having decreasing amplitude. During a reset operation, the waveform generation device (108) may generates a waveform that is a pulse having increasing amplitude. The shape of the waveform to be applied to the memristive element (104), referred to as the "memristive waveform", may be distinct from the shape of the waveform to be applied to the gate of the selecting transistor (106), referred to as the "gate waveform." The gate waveform being used to generate the desired memristive waveform across the memristive element (104).

The waveform generation device (108) passes the generated shaped gate waveform to the selecting transistors (106). Specifically, the shaped gate waveforms are passed to gates of the selecting transistors (106) of the number of bit cells (102). In this fashion, a target bit cell (102) is selected. While as depicted in FIG. 1, the waveform generation device (108) passes the shaped gate waveform to multiple bit cells (102-1, 102-2, 102-3), one bit cell (102) may be selected on account of corresponding row lines being activated, whereas bit cells (102) that are unselected correspond to unactivated row lines.

The shaped gate waveform generated by the waveform generation device (108) allows for an enhanced switching operation. For example, usage of a non-square waveform applied across the memristive element (104) of the bit cell (102) leads to increased endurance of the array (100), better retention of state of the memristive elements (104), and enhanced read and write margins. Applying the shaped gate waveform at the gates of the selecting transistors (106) allows for simpler circuitry to deliver the shaped memristive waveform. For example, when a shaped memristive waveform is applied at the row lines, circuitry to time the opening and closing of the transistor at specific times relative to the signal on the row lines is complex, costly, and takes up valuable space on a silicon wafer. Applying the gate waveform at the gate of the transistor (106) avoids such circuitry. Moreover, when applying a waveform to the rails, electrical conditions such as capacitance within the rails, the switching of other memristive elements (104), as well as IR drop throughout the array (100) introduce uncertainty into the shape, timing, and other characteristics of the waveform. By applying the shaped gate waveform at the gate, more certainty, and therefore finer control is possible over the memristive waveform and array. (100) in general.

Figure 2:
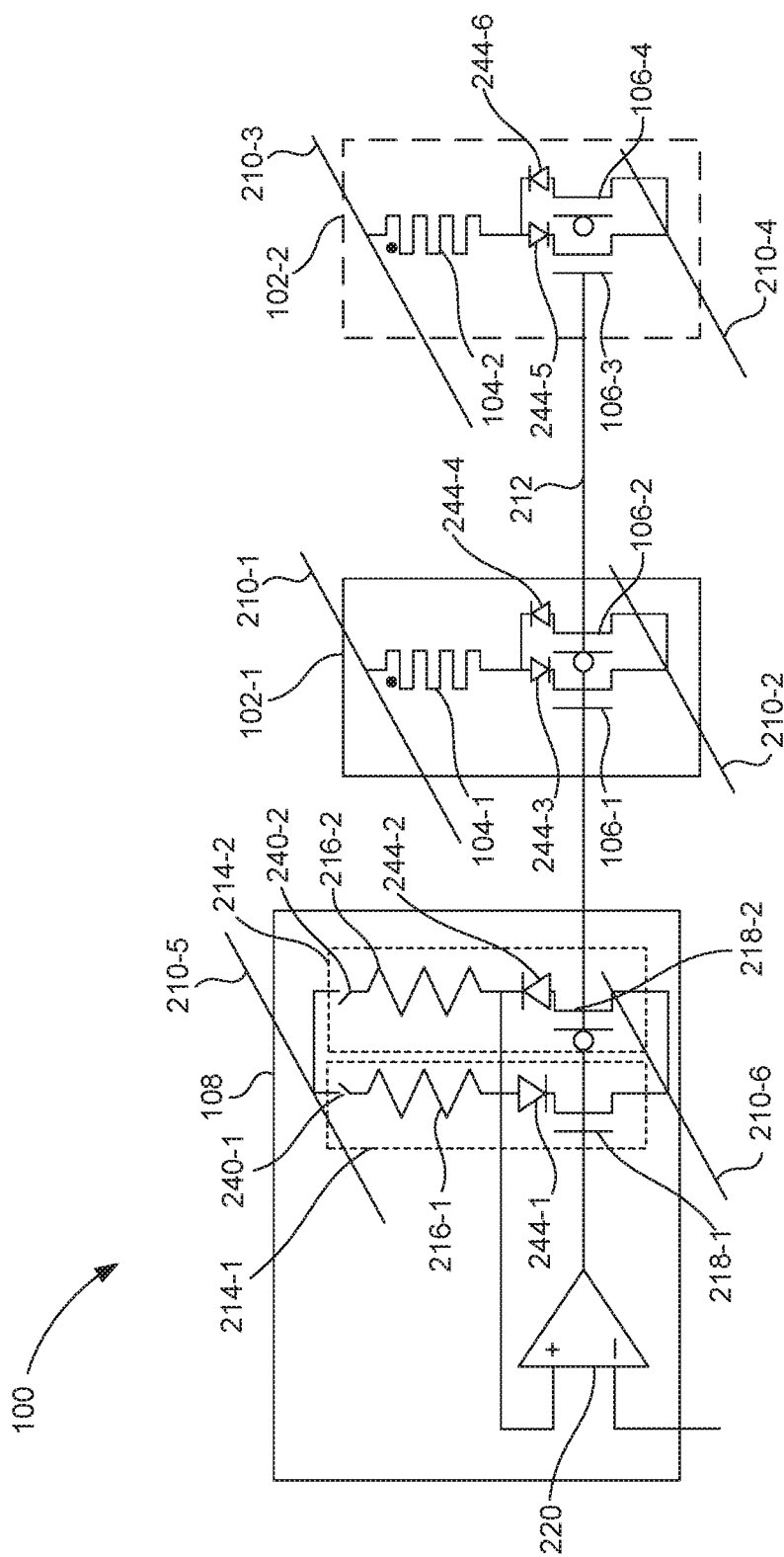
FIG. 2 is a circuit diagram of a memristive array with a waveform generation device, according to one example of the principles described herein.

FIG. 2 is a circuit diagram of an array (100) with a waveform generation device (108), according to one example of the principles described herein. The array (100) includes a number of row lines (210-1, 210-2, 210-3, 210-4, 210-5, 210-6). Bit cells (102) and the waveform generation device (108) are disposed between adjacent row lines (210). As described above, each bit cell (102) includes a memristive element (104). In the array (100), each bit cell (102) also includes multiple parallel selecting transistors (106-1, 106-2, 106-3, 106-4) that are serially coupled to a memristive element (104-1, 104-2). For example, first and second selecting transistors (106-1, 106-2) are coupled to a first memristive element (104-1) and third and fourth selecting transistors (106-3, 106-4) are coupled to a second memristive element (104-2). As described above, a waveform generation device (108) can carry out a set operation and a reset operation. Accordingly, each bit cell (102) includes a selecting transistor (106) for either operation.

For example, one selecting transistor (106-1, 106-3) of each bit cell (102) may be an n-type field effect transistor (NFET) (106-1, 106-3) used for a set operation and another selecting transistor (106-2, 106-4) of each bit cell (102) may be a p-type field effect transistor (PFET) (106-2, 106-4) used for a reset operation. The second and fourth selecting transistors (106-2, 106-4) are PFETs because if using an NFET during a reset operation to generate the desired waveform, the NFET would have to be operated as a source follower and the voltage applied at the gate of the second and fourth selecting transistors (106-2, 106-4) would have to be at least an amount $V_t$ greater than the memristive element (104) bottom electrode, requiring significantly more head voltage than when using a PFET.

Alternatively, operating the NFET in the ohmic region, the gate of the second and fourth selecting transistors (106-2, 106-4) would be $V_t$ above the $V_{reset}$ voltage value, which would likely require the generation and distribution of a high supply voltage. To get these voltage values as stated, a voltage headroom, i.e., voltage potential between the row lines (210) would have to be greater than if a PFET were used as the second and fourth, i.e., reset, selecting transistors (106-2, 106-4). For simplicity in FIG. 2, a few instances of some of the components are indicated with reference numbers, while others are not.

The gates of the selecting transistors (106) of columns of bit cells are coupled to one another via a column line (212). Accordingly, as a shaped gate waveform is generated, it is passed to the gates of multiple selecting transistors (106). However, as just one bit cell (102-1) along the column is targeted via the corresponding row lines (210-1, 210-2), just that particular bit cell (102-1) is activated. By comparison, although an unselected bit cell (102-2) receives the shaped gate waveform, current does not pass through that particular bit cell (102-2) as the corresponding row lines (210-3, 210-4) are not receiving a voltage signal.

More detail regarding the activation of a bit cell (102) is now provided. As described above, the memristive elements (104) may switch states to either store memory or carry out a logic operation. This is done by 1) generating a voltage potential across the memristive element (104) and 2) closing a corresponding selecting transistor (106) to allow the voltage potential to exist. To select a target memristive element (104), the corresponding row lines (210) receive a voltage signal. For example, when a first memristive element (104-1) is targeted, the corresponding row lines (210-1, 210-2) receive a voltage such that a voltage potential across the first memristive element (104-1) is sufficient to switch the first memristive device (104-1) state. By comparison, non-target bit cells (102), for example, the second bit cell (102-2) indicated by the dashed box, has corresponding row lines (210-3, 210-4) that do not receive any voltages; therefore, the bit cells that share these row lines are not selected.

Different voltage potentials generated across a target memristive element (104) may be used for different types of switching. For example, during a set operation, i.e., switching a memristive element (104) from a high resistance state to a low resistance state, the voltage potential may be generated by applying a first voltage, $V_{set}$, to a first row line (210-1) and applying a second voltage, $V_{ground}$, to a second row line (210-2), thus resulting in a voltage potential of $V_{set}-V_{ground}$. By comparison, during a reset operation, i.e., switching the memristive element (104) from a low resistance state to a high resistance state, the voltage potential may be generated by applying a third voltage, $V_{reset}$, to the second row line (210-2) and applying the second voltage, $V_{ground}$, to the first row line (210-1), thus resulting in a voltage potential of $V_{ground}-V_{reset}$.

As described above, the waveform generation device (108) can generate multiple gate waveforms, specifically a set gate waveform and a reset gate waveform. Accordingly, the waveform generation device (108) includes multiple waveform generation cells (214-1, 214-2). Each waveform generation cell (214) is to carry out a different operation by generating a different gate waveform. For example, the first waveform generation cell (214-1) may be used during a set operation to generate a set gate waveform while the second waveform generation cell (214-2) may be used during a reset operation to generate a reset gate waveform. The different gate waveforms are passed to the gates of selecting transistors (106) in the corresponding column of bit cells (102). Specifically, the first waveform generation cell (214-1) may generate a shaped gate waveform for a set operation and interact with a first selecting transistor (106-1) of a first, and target, bit cell (102-1) during one time period while the second waveform generation cell (214-2) may generate a shaped gate waveform for a reset operation and interact with a second selecting transistor (106-2) of the first, and target, bit cell (102-1) during a second time period.

Each waveform generation cell (214) includes multiple components. For example, each waveform generation cell (214) includes a resistor (216), a regulating transistor (218), an isolation diode (244), and a switch (240). The gates of the regulating transistors (218-1, 218-2) are coupled to the gates of the selecting transistors (106) of the bit cells (102) via the column line (212). The switches (240) are to activate the different waveform generation cells (214-1, 214-2). For example, during a set operation, a first switch (240-1) is closed to allow current to pass through the first waveform generation cell (214-1). In this example, the second switch (240-2) is open to prevent current from passing through the second waveform generation cell (214-2). By comparison, during a reset operation, the first switch (240-1) is open and the second switch (240-2) is closed. In some examples, the switches (240) may be field-effect transistors (FETs) operated as switches.

Figure 3:
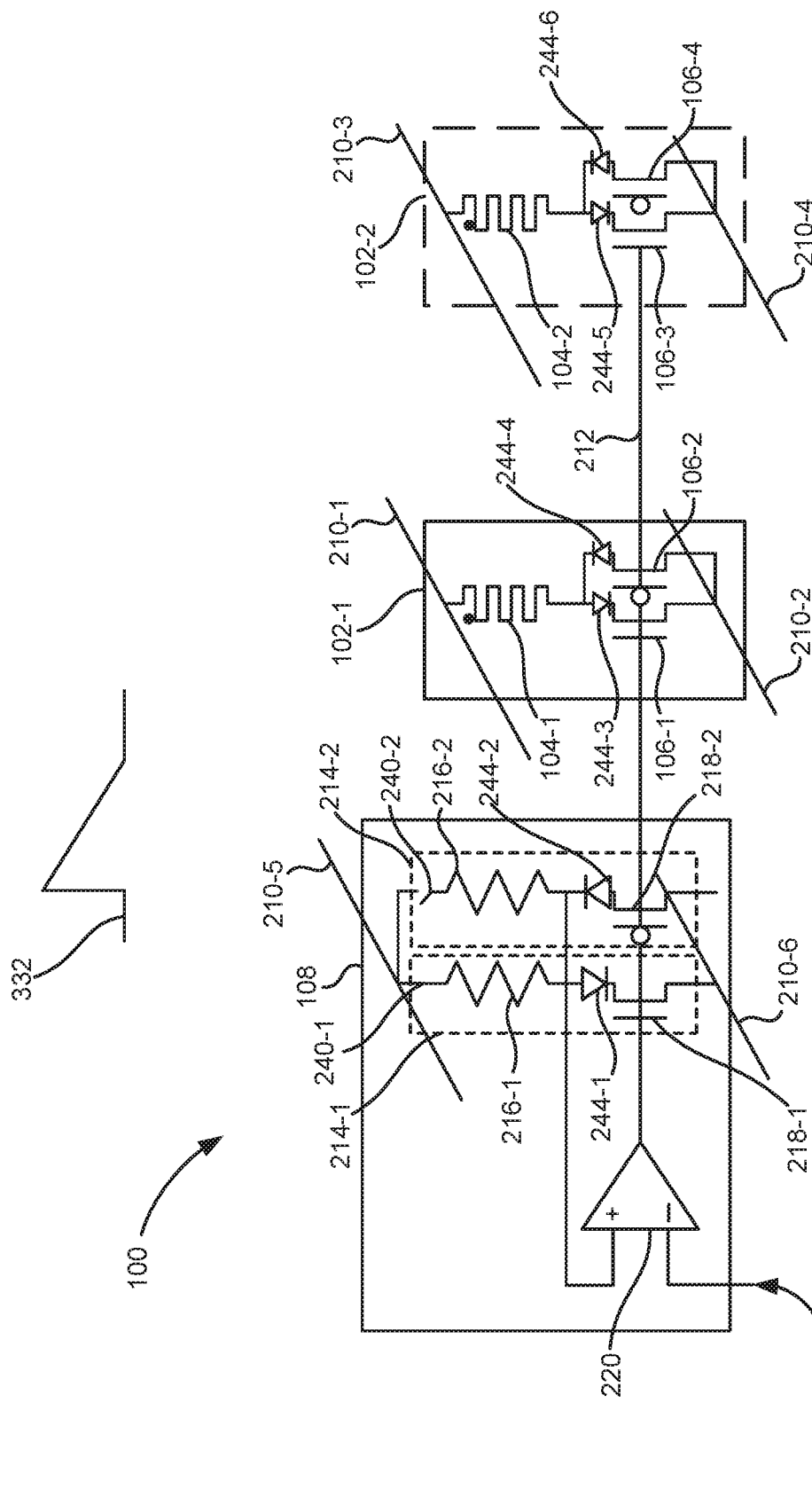
FIG. 3 is a diagram of a memristive array with a waveform generation device as used to set a memristive element, according to one example of the principles described herein.

The waveform generation device (108) and each of the bit cells (102) also include diodes (244-1, 244-2, 244-3, 244-4, 244-5, 244-6) to prevent current flow through the regulating transistor (218-1, 218-2) or the selecting transistors (106-1, 106-2, 106-3, 106-4) respectively, when not in use. Doing so ensures that just the first regulating transistor (218-1) is conducting during a set operation and that just the second regulating transistor (218-2) is conducting during a reset operation. The presence of the diodes (244) allows the waveform generation cells (214) and the different selecting transistors (106) to share a common-column gate signal. The diodes (244) act as switches for the FETs such that while both the NFET and PFET have a live gate waveform during both sets and resets, the diodes (244) prevent the wrong one from conducting channel current The waveform generation device (108) also includes an operational amplifier (220) to generate a desired gate waveform. FIG. 3 provides an example of the array (100) in generating a set gate waveform. Specifically, FIG. 3 is a diagram of a memristive array (100) with a waveform generation device (108) as used to set a memristive element (104), according to one example of the principles described herein. During a set operation, a static voltage potential is generated across a target first bit cell (102-1) by applying voltages to the corresponding row lines (210-1, 210-2). The target bit cell is indicated with a solid box. For example, a voltage, $V_{set}$, is passed along a first row line (210-1) while a second voltage, $V_{ground}$, is passed along a second row line (210-2). This same voltage potential is passed to the waveform generation device (108), via the row lines (210-5, 210-6) corresponding to the waveform generation device (108). Note that no voltages are passed along the second, and unselected bit cell (102-2) row lines (210-3, 210-4). Accordingly, there will be no current passing through the unselected bit cell (102-2). While specific reference is made to a specific voltages being applied to the row lines (210-1, 210-2) corresponding to the target first bit cell (102-1) any voltage values may be used to generate a desired voltage potential.

The set memristive waveform (332) may be a pulse that slopes downward, or that decreases in amplitude as indicated in FIG. 3. In the set operation, a first resistor (216-1) of the first waveform generation cell (214-1) has a value equal to the high resistance state of a memristive element (104). In other words, the resistance of the first waveform generation cell (214-1) approximates the resistance of a memristive element (104) in a high resistance state. Doing so allows generation of the appropriate memristive waveform (332) across the memristive element (104) in a high resistance state. In other words, as a memristive element (104) in a set operation is initially in a high resistance state, the memristive waveform (332) across it will be the same as a memristive waveform (332) across the first resistor (216-1) as the first resistor (216-1) and the target memristive element (104-1) are at the same resistance. This will change after the memristive element (104) switches to a low resistance state, but that is irrelevant as it is after a switching event occurs.

Via the operational amplifier (220), the output gate waveform that produces the desired memristive waveform (332) can be generated. In order to generate the desired set memristive waveform (332), the drain of the first regulating transistor (218-1) should match the voltage applied to the operational amplifier's (220) negative input. As the negative input voltage rises, the operational amplifier (220) output voltage drops and the first regulating transistor (218-1) tends toward turning "off," i.e., a high resistance state. Doing so allows the current flowing through the load (in this case the first resistor (216-1)) to pull the drain node voltage up. However, as the drain of the first regulating transistor (218-1) is tied to the operational amplifier (220) positive input, the operational amplifier (220) output voltage tends to rise. This negative feedback loop drives the voltage on the positive input to exactly match that of the negative input such that the voltage of the drain of the first regulating transistor (218-1) tracks the signal on the operational amplifier's (220) negative input. In the process, the gate waveform to produce the desired memristive waveform (332) is generated and output on the column line (212). As just the first switch (240-1) is closed, this memristive waveform (332) is therefore passed through the first waveform generation cell (214-1).

In addition to the static signal passing through the first waveform generation cell (214-1), the operational amplifier (220) also receives an input waveform (334), which input waveform (334) is the inverse of the intended output memristive waveform (332). This is because, the voltage at the top electrode, $V_{te}$, of the memristive element (104-1) is tied to the first row line (210-1) which passes a $V_{set}$ voltage and the voltage at the bottom electrode, $V_{be}$, is what is manipulated. In other words, the voltage potential across the first memristive element (104-1), $V_{mr}$, during a set operation can be represented as $V_{mr}=V_{te}-V_{be}$. As $V_{set}=V_{te}$, if the input waveform (334) has the form $V_{set}-V_{waveform}$, where $V_{waveform}$ represents the intended set memristive waveform (332), then $V_{mr}$ can be represented as $V_{mr}=V_{set}-(V_{set}-V_{waveform})$. Thus the output memristive waveform (332), $V_{waveform}$, is generated across the first memristive element (104-1). The regulating transistor (218-1) of the first waveform generation cell (214-1) is an n-type field effect transistor (NFET).

Figure 4:
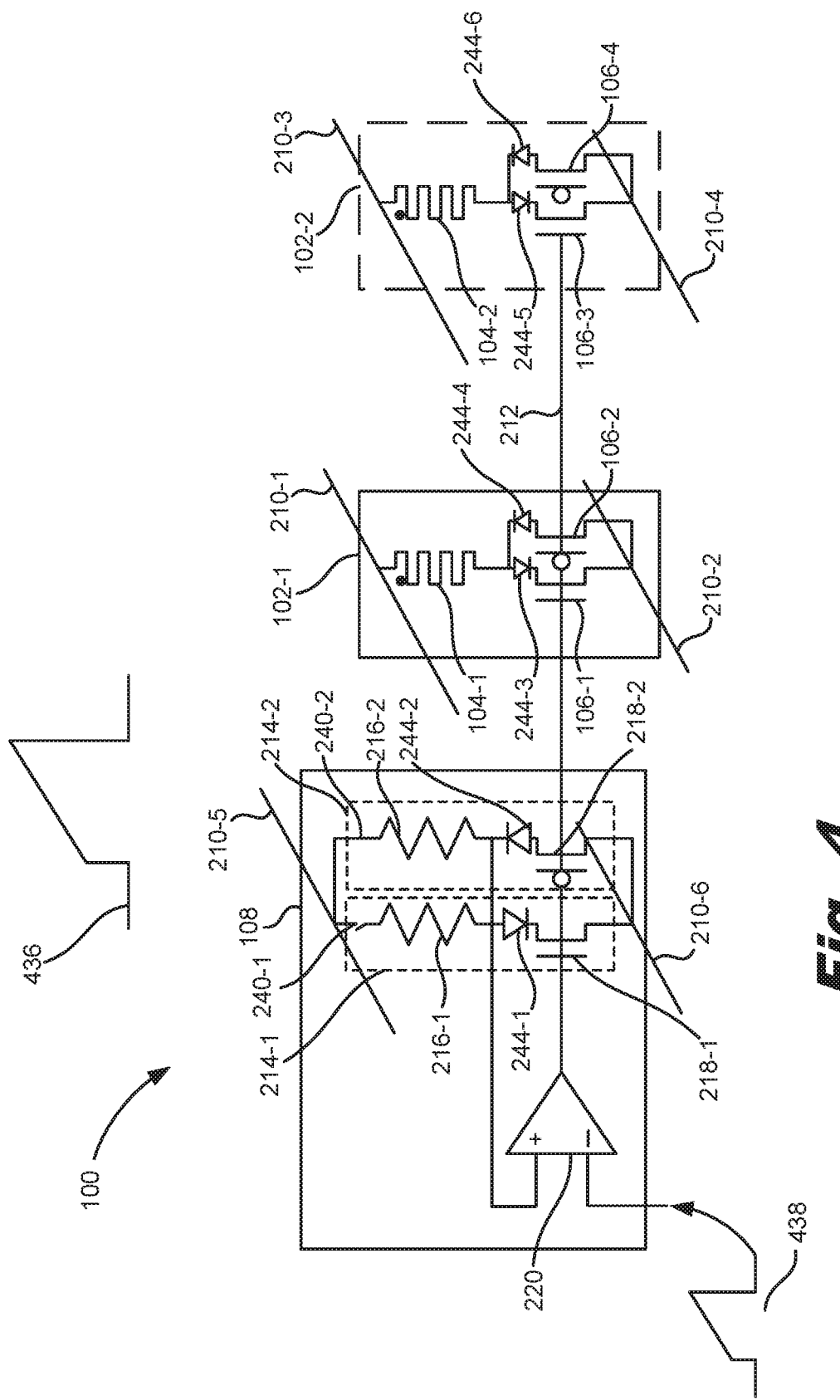
FIG. 4 is a diagram of a memristive array with a waveform generation device as used to reset a memristive element, according to one example of the principles described herein.

FIG. 4 is a diagram of a memristive array (100) with a waveform generation device (108) as used to reset a memristive element (104), according to one example of the principles described herein. During a reset operation, as described a static voltage potential is generated across a target first bit cell (102-1) by applying voltages to the corresponding row lines (210-1, 210-2). For example, a voltage, $V_{reset}$, is passed along a second row line (210-2) while a second voltage, $V_{ground}$, is passed along a first row line (210-1). This same voltage potential is passed to the waveform generation device (108), via the row lines (210-5, 210-6) corresponding to the waveform generation device (108). Note that no voltages are passed along the unselected second bit cell (102-2) row lines (210-3, 210-4). Accordingly, there will be no current passing through the unselected bit cell (102-2).

The reset memristive waveform (436) may be a pulse that slopes upward, or that increases in amplitude as indicated in FIG. 4. By way of example, during a reset operation, the voltage of the top electrode, $V_{te}$, is at ground via the first row line (210-1). Accordingly, the voltage across the memristive element (104), $V_{mr}$, during a reset operation can be identified by the equation $V_{mr}=V_{be}-V_{te}$ or, as the top electrode is ground, $V_{mr}=V_{be}-0$. In other words, whatever voltage is applied to the bottom electrode is equal to the voltage across the memristive element (104). Accordingly it is the bottom electrode voltage that is manipulated.

In the reset operation, the second resistor (216-2) of the second, or reset, waveform generation cell (214-2) has a value equal to the low resistance state of a memristive element (104). In other words, the resistance of the second waveform generation cell (214-2) approximates the resistance of a memristive device (104) in a low resistance state. Doing so allows generation of the appropriate memristive waveform (436) across the memristive element (104) in a low resistance state. In other words, as the memristive element (104) in a reset operation is initially in a low resistance state, the memristive waveform (436) across it will be the same as a memristive waveform (436) across the second resistor (216-2), as the second resistor (216-2) and the target memristive element (104-1) are at the same resistance. This will change after the memristive element (104) switches to a high resistance state, but that is irrelevant as it is after a switching event occurs.

Via the operational amplifier (220), the output gate waveform that produces the desired memristive waveform (436) can be generated. In order to generate the reset memristive waveform (436), the drain voltage of the second regulating transistor (218-2) should match the voltage applied to the operational amplifier's (220) negative input. As the voltage input on the operational amplifier (220) negative input rises, the operational amplifier (220) output voltage drops and the second regulating transistor (218-2) tends toward turning "on," i.e., a low resistance state. Doing so allows the regulating transistor (218-2) to dump more current onto the drain node than the load (the second resistor (216-2)) is sinking away. However, as the drain of the second regulating transistor (218-2) is tied to the operational amplifier (220) positive input, the operational amplifier (220) output voltage tends to rise. This negative feedback loop drives the voltage on the positive input to exactly match that of the negative input such that the drain voltage of the second regulating transistor (218-2) matches the negative input. In the process, the gate waveform to produce the desired memristive waveform (436) is generated and output on the column line (212). As just the second switch (240-2) is closed, this memristive waveform is therefore passed through the second waveform generation cell (214-2).

Accordingly, in addition to the static signal passing through the waveform generation cell (214-2), the operational amplifier (220) also receives an input waveform (438), which input waveform matches the intended memristive waveform (436). The regulating transistor (218-2) of the second waveform generation cell (214-2) is a p-type field effect transistor (PFET).

Figure 5:
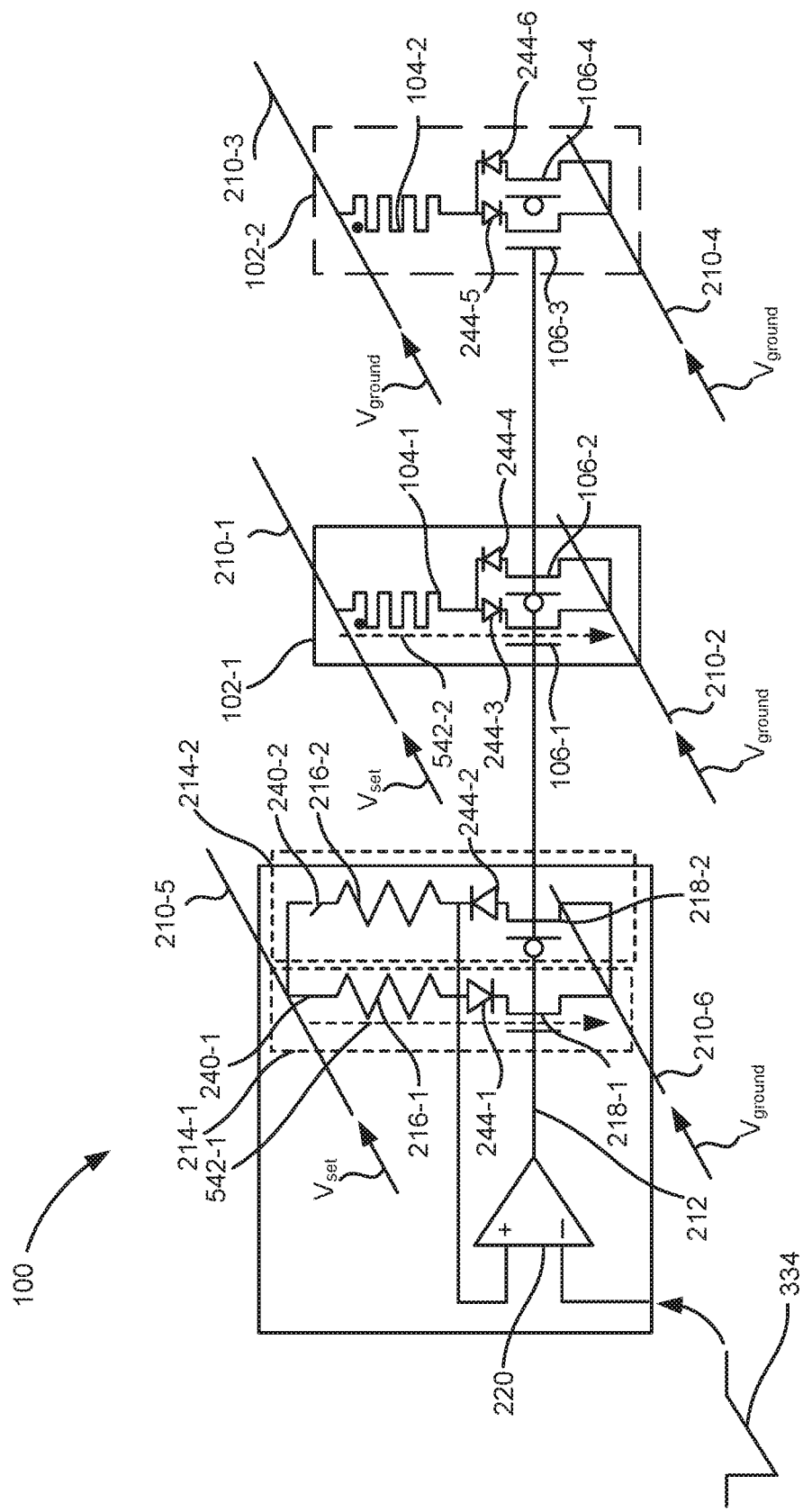
FIG. 5 is a diagram of a set operation in a memristive array with a waveform generation device, according to one example of the principles described herein.

FIG. 5 is a diagram of a set operation in a memristive array (100) with a waveform generation device (108), according to one example of the principles described herein. As described above, during a set operation, a voltage potential is applied across a target first memristive element (104-1) by passing voltages to the corresponding row lines (210-1, 210-2). In this example, the voltage potential is generated by passing a set voltage, $V_{set}$, across the first row line (210-1) and a ground voltage, $V_{ground}$, to the second row line (210-2) which causes current to flow from the top electrode of the first memristive element (104-1) towards the bottom electrode as indicated by the line (542-2) when the first selecting transistor (106-1), NFET is conducting. While specific reference is made to specific voltage values, any voltage values may be used to generate a desired voltage potential across a target first memristive element (104-1).

Note the presence of a third diode (244-3) in the target bit cell (102-1) which ensures that current flows from the top electrode to the bottom electrode just through the first selecting transistor (106-1) as indicated by the line (542-2). Note that in the unselected bit cell (102-2), both row lines (210-3, 210-4) are set to $V_{ground}$.

The same voltage potential, $V_{set}-V_{ground}$ is applied across the waveform generation device (108) via the corresponding row lines (210-5, 210-6). Note the presence of the first diode (244-1) in the first wave generation cell (214-1) which ensures that current flows towards the first regulating transistor (218-1) just through the first resistor (216-1) during set operations. In this example, a number of switches (240-1, 240-2) activate the waveform generation cells (214). Specifically, a first switch (240-1) is closed to allow current to pass through the first resistor (216-1) as indicated by the arrow (542-1). Based on the operation of the operational amplifier (220), the gate waveform is passed to the target bit cell (102-1) along the column line (212).

In this example, a second switch (240-2) is open to prevent current from passing through the second resistor (216-2). The waveform generation device (108) and each of the bit cells (102) also include diodes (244-1, 244-2, 244-3, 244-4, 244-5, 244-6) to prevent current flow through the regulating transistor (218-1, 218-2) or the selecting transistors (106-1, 106-2, 106-3, 106-4) respectively, when not in use. Doing so ensures that just the first regulating transistor (218-1) is conducting during a set operation and that just the second regulating transistor (218-2) is conducting during a reset operation. The presence of the diodes (244) allows the waveform generation cells (214) and the different selecting transistors (106) to share a common-column gate signal.

Figure 6:
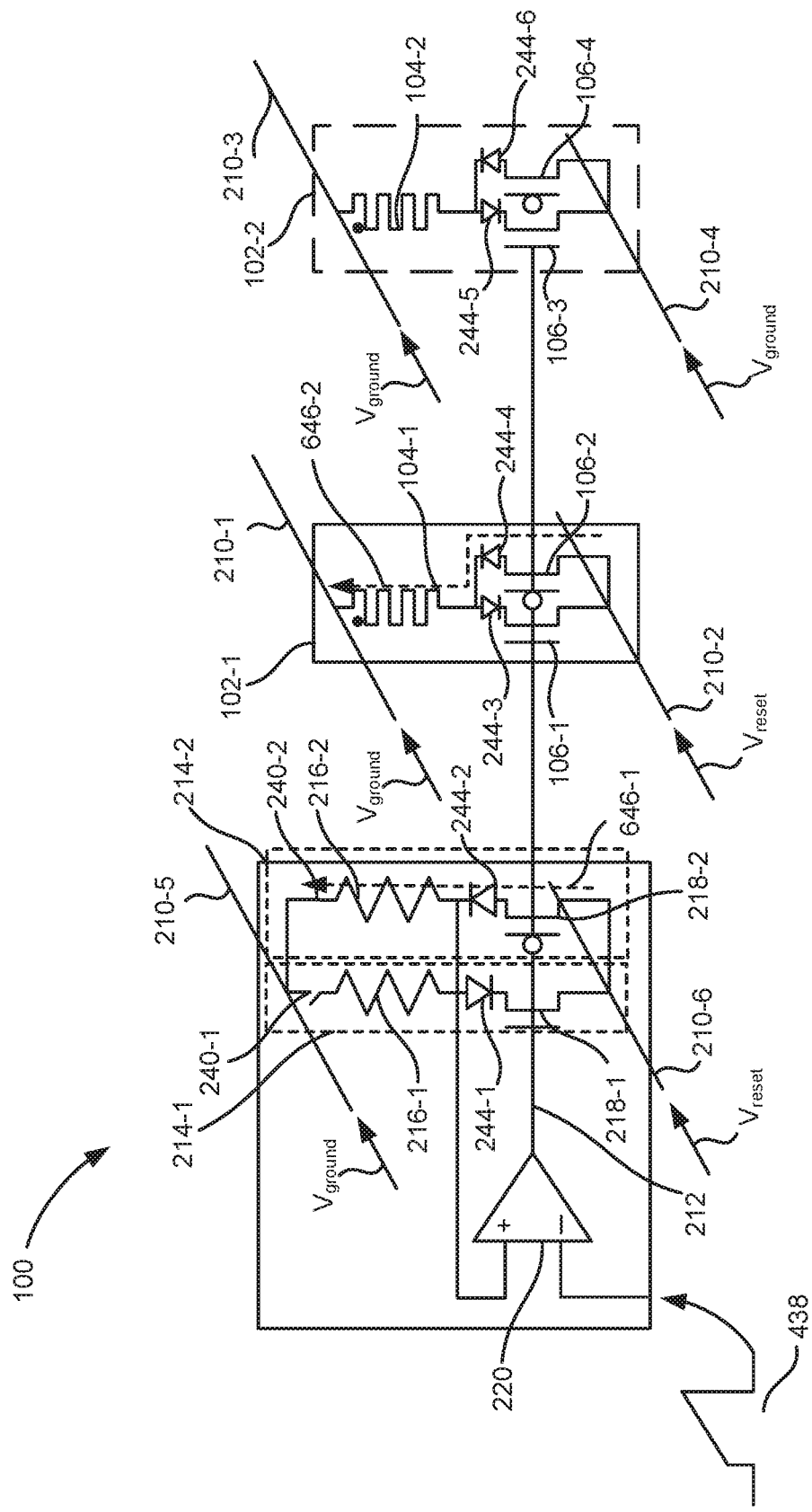
FIG. 6 is a diagram of a reset operation in a memristive array with a waveform generation device, according to one example of the principles described herein.

FIG. 6 is a diagram of a reset operation in a memristive array (100) with a waveform generation device (108), according to one example of the principles described herein. As described above, during a reset operation, a voltage potential is applied across a target first memristive element (104-1) by passing voltages to the corresponding row lines (210-1, 210-2). In this example, the voltage potential is generated by passing a reset voltage, $V_{reset}$, across the second row line (210-2) and a ground voltage, $V_{ground}$, to the first row line (210-1) which causes current to flow through the bottom electrode to the top electrode of the memristive element (104-1) when the reset transistor (106-2) PFET is conducting. While specific reference is made to specific voltage values, any voltage values may be used to generate a desired voltage potential across a target first memristive element (104-1).

Note the presence of the fourth diode (244-4) in the target bit cell (102-1) which ensures that current flows from the bottom electrode to the top electrode just through the second selecting transistor (106-2) as indicated by the line (646-2). Note that in the unselected bit cell (102-2), both row lines (210-3, 210-4) are set to ground.

The same voltage potential, $V_{ground}-V_{reset}$, is applied across the waveform generation device (108) via the corresponding row lines (210-5, 210-6). Note the presence of the second diode (244-2) in the second waveform generation cell (216-2) which ensures that current flowing through the second regulating transistor (218-2), the PFET, is just through the second resistor (216-2). In this example, a second switch (240-2) is closed to allow current to pass through the second resistor (216-2) as indicated by the arrow (646-1). Based on the operation of the operational amplifier (220), the gate waveform is passed along the column line (212) to the target bit cell (102-1).

In this example, a first switch (240-1) is open to prevent current from passing through the first resistor (216-1). The waveform generation device (108) and each of the bit cells (102) also include diodes (244-1, 244-2, 244-3, 244-4, 244-5, 244-6) to prevent current flow through the regulating transistor (218-1, 218-2) or the selecting transistors (106-1, 106-2, 106-3, 106-4) respectively, when not in use. Doing so ensures that just the first regulating transistor (218-1) is conducting during a set operation and that just the second regulating transistor (218-2) is conducting during a reset operation. The presence of the diodes (244-1, 244-2, 244-3, 244-4, 244-5, 244-6) allows for waveform generation cells (214) and the different selecting transistors (106) to share a common-column gate signal.

Figure 7:
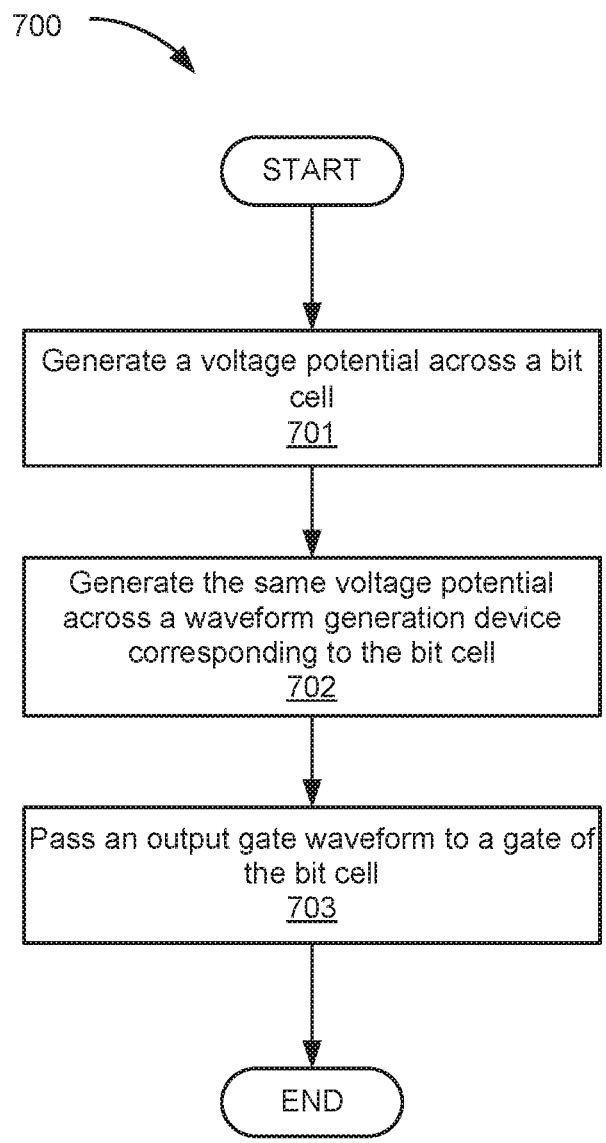
FIG. 7 is a method for switching a memristive element using the waveform generation device, according to one example of the principles described herein.

FIG. 7 illustrates a method (700) for switching a memristive element (FIG. 1, 104) using a waveform generation device (FIG. 1, 108), according to another example of the principles described herein. According to the method (700), a voltage potential is generated (block 701) across a bit cell (FIG. 1, 102) via adjacent row lines (FIG. 2, 210) that correspond to the bit cell (FIG. 1, 102). This voltage may be a static voltage that, once turned on, is a constant value until it is turned off. In some examples, a single row of bit cells (FIG. 1, 102) is activated at a time. However, the mere application of the voltage to the row lines (FIG. 2, 210) does not mean that a bit cell (FIG. 1, 102) is active in that its state can be switched. First, a selecting transistor (FIG. 1, 106) of the bit cell (FIG. 1, 102) is to be closed. The voltage potential generated (block 701) across the bit cell (FIG. 1, 102) may be either a set voltage potential to move the bit cell (FIG. 1, 102) from a high resistance state to a low resistance state or a reset voltage potential to move the bit cell (FIG. 1, 102) from a low resistance state to a high resistance state. The set voltage potential and the reset voltage potential may be of different values and/or of different polarities.

This same voltage potential is generated (block 702) across a waveform generation device (FIG. 1, 108). Similar to with the bit cell (FIG. 1, 102), the voltage potential across the waveform generation device (FIG. 1, 108) is generated by passing voltages to corresponding row lines (FIG. 2, 210-5, 210-6) corresponding to the waveform generation device (FIG. 1, 108). This voltage may be a static voltage that, once turned on, is a constant value until it is turned off. By passing the same voltage potential across the waveform generation device (FIG. 1, 108) and on account of the waveform generation device having resistors (FIG. 2, 216) with the same resistance as the memristive elements (FIG. 1, 104) in differing states, the memristive device (FIG. 1, 104) resistance can be accounted for in generation of the output gate waveform, so as to ensure that the output gate waveform will produce the intended memristive waveform for the memristive element (FIG. 1, 104). Were such control not used, an input waveform might be altered due to the capacitance of the row lines (FIG. 2, 210) as well as changes in current due to other memristive elements (FIG. 1, 104) switching state.

An output gate waveform is then passed (block 703) to a gate of the bit cell (FIG. 1, 102) that is selected. This is done by combining 1) an input waveform and 2) feedback from the voltage potential passing through the waveform generation device (FIG. 1, 108) through an operational amplifier (FIG. 2, 220). In contrast to the static voltages passed through the corresponding row lines (FIG. 2, 210), the output gate waveform that is passed may be a dynamic waveform, meaning that between when it is turned on and off, the voltage changes value, or the waveform changes shape. That is, the waveform may be dynamic.

By relying on the feedback resulting from the voltage potential passing through a resistor (FIG. 2, 216), the positive input of the operational amplifier (FIG. 2, 220) is made to match the negative input such that the operational amplifier (FIG. 2, 220) output waveform is the correct gate waveform to produce the desired memristive waveform; thus ensuring that the output gate waveform is what is intended. The output gate waveform is then passed to gates of transistors (FIG. 1, 106) of the bit cells (FIG. 1, 102) that are coupled to the waveform generation device (FIG. 1, 108), which bit cells (FIG. 1, 102) can be said to be arranged in a column. Thus, as described above, bit cells (FIG. 1, 102) in a particular row have their corresponding row lines (FIG. 2, 210) supplying them with a static voltage potential. In other words there is an active row. The waveform generation device (FIG. 1, 108) then passes a signal to gates of columns of bit cells (FIG. 1, 102), thus generating an active column. The intersection of this active row and active column results in a bit cell (FIG. 1, 102) that has both the voltage potential and an active transistor. The memristive element (FIG. 1, 104) at this intersection is active, and the targeted bit cell (FIG. 1, 102-1) can be written to or read from.

Figure 8:
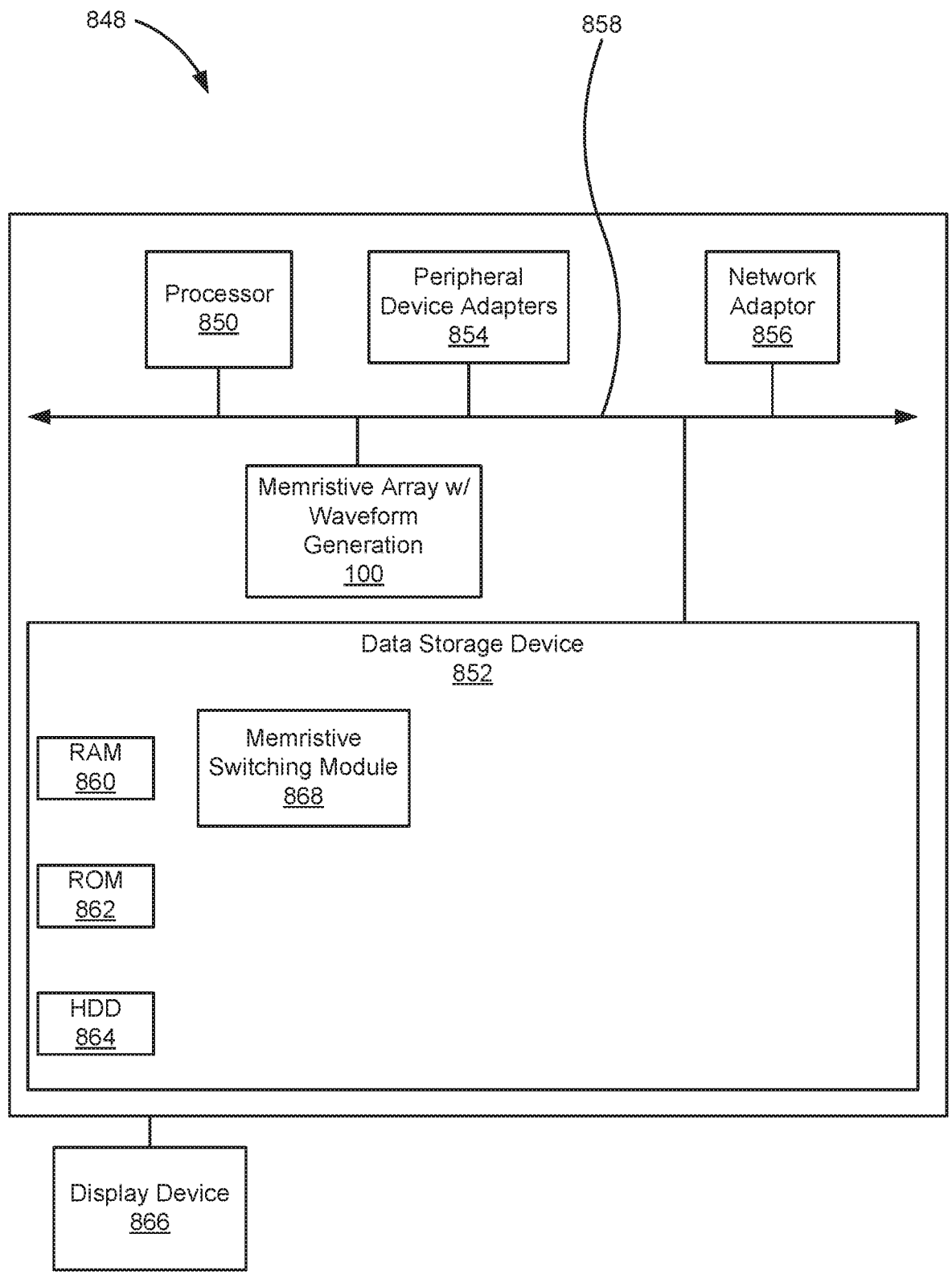
FIG. 8 is a diagram of a computing system that uses a memristive array with a waveform generation device, according to one example of the principles described herein.

FIG. 8 is a diagram of a computing device (848) that uses a memristive array (100) with a waveform generation device (FIG. 1, 108), according to one example of the principles described herein. The computing device (848) may be implemented in an electronic device. Examples of electronic devices include servers, desktop computers, laptop computers, personal digital assistants (PDAs), mobile devices, smartphones, gaming systems, and tablets, among other electronic devices.

The computing device (848) may be utilized in any data processing scenario including, stand-alone hardware, mobile applications, through a computing network, or combinations thereof. Further, the computing device (848) may be used in a computing network, a public cloud network, a private cloud network, a hybrid cloud network, other forms of networks, or combinations thereof. In one example, the methods provided by the computing device (848) are provided as a service over a network by, for example, a third party.

To achieve its desired functionality, the computing device (848) includes various hardware components. Among these hardware components may be a number of processors (850), a number of data storage devices (852), a number of peripheral device adapters (854), and a number of network adapters (856). These hardware components may be interconnected through the use of a number of busses and/or network connections. In one example, the processor (850), data storage device (852), peripheral device adapters (854), and a network adapter (856) may be communicatively coupled via a bus (858).

The processor (850) may include the hardware architecture to retrieve executable code from the data storage device (852) and execute the executable code. The executable code may, when executed by the processor (850), cause the processor (850) to implement at least the functionality of switching a memristive element of a memristive array using a waveform generation device. The functionality of the computing device (848) is in accordance to the methods of the present specification described herein. In the course of executing code, the processor (850) may receive input from and provide output to a number of the remaining hardware units.

The data storage device (852) may store data such as executable program code that is executed by the processor (850) or other processing device. As will be discussed, the data storage device (852) may specifically store computer code representing a number of applications that the processor (850) executes to implement at least the functionality described herein.

The data storage device (852) may include various types of memory modules, including volatile and nonvolatile memory. For example, the data storage device (852) of the present example includes Random Access Memory (RAM) (860), Read Only Memory (ROM) (862), and Hard Disk Drive (HDD) memory (864). Many other types of memory may also be utilized, and the present specification contemplates the use of many varying type(s) of memory in the data storage device (852) as may suit a particular application of the principles described herein. In certain examples, different types of memory in the data storage device (852) may be used for different data storage needs. For example, in certain examples the processor (850) may boot from Read Only Memory (ROM) (862), maintain nonvolatile storage in the Hard Disk Drive (HDD) memory (864), and execute program code stored in Random Access Memory (RAM) (860).

The data storage device (852) may include a computer readable medium, a computer readable storage medium, or a non-transitory computer readable medium, among others. For example, the data storage device (852) may be, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (854, 856) in the computing device (848) enable the processor (850) to interface with various other hardware elements, external and internal to the computing device (848). For example, the peripheral device adapters (854) may provide an interface to input/output devices, such as, for example, display device (866), a mouse, or a keyboard. The peripheral device adapters (854) may also provide access to other external devices such as an external storage device, a number of network devices such as, for example, servers, switches, and routers, client devices, other types of computing devices, and combinations thereof.

The display device (866) may be provided to allow a user of the computing device (848) to interact with and implement the functionality of the computing device (848). The peripheral device adapters (854) may also create an interface between the processor (850) and the display device (866), a printer, or other media output devices. The network adapter (856) may provide an interface to other computing devices within, for example, a network, thereby enabling the transmission of data between the computing device (848) and other devices located within the network.

The computing device (848) may, when executed by the processor (850), display the number of graphical user interfaces (GUIs) on the display device (866) associated with the executable program code representing the number of applications stored on the data storage device (852). The GUIs may display, for example, interactive screenshots that allow a user to interact with the computing device (848) to input values in association with the memristive array (100) as will be described in more detail below. Additionally, via making a number of interactive gestures on the GUIs of the display device (866), a user may obtain a dot product value based on the input data. Examples of display devices (866) include a computer screen, a laptop screen, a mobile device screen, a personal digital assistant (PDA) screen, and a tablet screen, among other display devices (866).

The computing device (848) may further include a memristive array (100) that uses a waveform generation device (FIG. 1, 108). The array (100) includes a number of bit cells (FIG. 1, 102) that include memristive elements (FIG. 1, 104) and selecting transistors (FIG. 1, 106). Such bit cells (FIG. 1, 102) are arranged in an array such as a cross-bar array. The array (100) also includes a waveform generation device (FIG. 1, 108) that generates multiple waveforms and passes the shaped waveforms to the gates of the selecting transistors (FIG. 1, 106) of the various bit cells (FIG. 1, 102).

The computing device (848) further includes a number of modules used in the implementation of the systems and methods described herein. The various modules within the computing device (848) include executable program code that may be executed separately. In this example, the various modules may be stored as separate computer program products. In another example, the various modules within the computing device (848) may be combined within a number of computer program products; each computer program product including a number of the modules.

The computing device (848) may include a memristive switching module (868) to, when executed by the processor (850), assist in the functionality of the memristive array (100). The memristive switching module (868), for example, is used to determine the voltages applied to the row lines of the array as well as the shape, size, duration, and other characteristics of the shaped waveform that is applied to gates of the transistors. The memristive switching module (868) also assists in selecting particular memristive elements to target. While specific reference is made to a few particular operations, the memristive switching module (868) carries out a number of different operations in conjunction with the switching of memristive elements in the memristive array.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (850) of the computing system or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

Using a waveform generation device that passes a non-square waveform to the gate of a bit cell 1) gives more control over the waveform pulse passed to a memristive element, which waveform pulse is used to switch the state of the memristive element; 2) avoids complications in passing a waveform via the row lines of an array; and 3) reduces the complexity and cost associated with applying a dynamic shaped waveform to the memristive array. However, it is contemplated that the devices disclosed herein may provide useful in addressing other matters and deficiencies in a number of technical areas. Therefore the systems and methods disclosed herein should not be construed as addressing any of the particular matters.

The preceding description has been presented to illustrate and describe examples of the principles described. This description is not intended to be exhaustive or to limit these principles to any precise form disclosed. Many modifications and variations are possible in light of the above teaching.

What is claimed is:

1. An array comprising:
   a number of bit cells, each bit cell comprising:
      a memristive element; and
      a selecting transistor serially coupled to the memristive element; and
   a waveform generation device coupled to the number of bit cells, wherein the waveform generation device comprises:
      a number of resistors:
      a number of regulating transistors serially coupled to the number of resistors; and
      an operational amplifier to receive inputs of an input waveform and from the drain of the number of regulating transistors to form an output waveform,
   the waveform generation device to:
      generate a shaped waveform to be applied to the number of bit cells to switch a state of the memristive element; and
      pass the shaped waveform to gates of the selecting transistors of the number of bit cells.

2. The array of claim 1, wherein the shaped waveform is a non-square waveform.

3. The array of claim 1, wherein the shaped waveform is a pulse with a decreasing amplitude.

4. The array of claim 1, wherein the shaped waveform is a pulse with an increasing amplitude.

5. The array of claim 1, wherein the waveform generation device generates at least one of a set waveform and a reset waveform.

6. An array comprising:
a number of memristive elements comprising:
a number of row lines;
a number of bit cells disposed between adjacent row lines, wherein:
each bit cell comprises a memristive element serially coupled to multiple parallel selecting transistors and a number of diodes to regulate current flow through one of the parallel selecting transistors; and
gates of the parallel selecting transistors of a column of bit cells are coupled to one another via a column line;
a number of waveform generation devices, wherein:
a waveform generation device is coupled to the column of bit cells;
the waveform generation device comprises multiple waveform generation cells, each waveform generation cell comprising a resistor, a regulating transistor, a diode, and a switch;
gates of regulating transistors of the waveform generation cells are coupled to gates of selecting transistors of the column of bit cells via the column line; and
each waveform generation cell generates a distinct waveform that is passed to gates of selecting transistors of the column of bit cells.

7. The array of claim 6, wherein:
a first waveform generation cell of the waveform generation device carries out a set operation; and
a second waveform generation cell of the waveform generation device carries out a reset operation.

8. The array of claim 7, wherein:
a regulating transistor of the first waveform generation cell is an n-type field-effect transistor (NFET); and
a regulating transistor of the second waveform generation cell is a p-type field-effect transistor (PFET).

9. The array of claim 7, wherein a resistor of the first waveform generation cell has a value of a target high resistance state of the memristive device.

10. The array of claim 7, wherein a resistor of the second waveform generation cell has a value of a target low resistance state of the memristive device.

11. The array of claim 7, wherein the waveform generation device generates multiple waveform shapes.

12. The array of claim 7, wherein a first diode of the bit cell regulates current flow through a first selecting transistor and a second diode of the bit cell regulates current flow through a second selecting transistor.

13. An method of switching a state of a memristive element, the switching comprising:
a number of bit cells, each bit cell comprising:
a memristive element; and
a selecting transistor serially coupled to the memristive element; and
a waveform generation device coupled to the number of bit cells, the waveform generation device to:
generating at least one of a set waveform and a reset shaped waveform, by a waveform generation device, to be applied to a number of bit cells coupled to the waveform generation device, each of the bit cells comprising the memristive element and a selecting transistor serially coupled to the memristive element; and
passing the at least one of the set waveform and the reset shaped waveform to gates of the selecting transistors of the number of bit cells.

14. The method of claim 13, wherein the at least one of the set waveform and reset shaped waveform is a non-square waveform.

15. The method of claim 14, wherein the at least one of the set waveform and reset shaped waveform is a reset waveform, the reset waveform being a pulse having an increasing amplitude.

16. The method of claim 14, wherein the at least one of the set waveform and reset shaped waveform is a set waveform, the set waveform being a pulse having a decreasing amplitude.

* * * * *